United States Patent [19]

Pedersen et al.

[11] Patent Number: 4,527,620
[45] Date of Patent: Jul. 9, 1985

[54] APPARATUS FOR CONTROLLING THERMAL TRANSFER IN A CYCLIC VACUUM PROCESSING SYSTEM

[75] Inventors: Bjorn O. Pedersen, Chelmsford; Jonathan A. Jost, Rockport, both of Mass.

[73] Assignee: Varian Associates, Inc., Palo Alto, Calif.

[21] Appl. No.: 606,052

[22] Filed: May 2, 1984

[51] Int. Cl.³ .............................................. F28F 9/00
[52] U.S. Cl. .................................. 165/80 D; 118/724; 118/728; 118/733; 118/50; 165/39; 165/86; 165/185; 269/903
[58] Field of Search ................. 165/80 R, 80 A, 80 B, 165/80 C, 80 D, 86, 185, 39, 40; 118/724, 728, 729, 730, 733, 50; 269/21, 26, 903; 51/217 L, 235, 324; 250/443.1, 492.1, 492.2, 492.3

[56] References Cited

U.S. PATENT DOCUMENTS

| 3,566,960 | 8/1969 | Stuart | 204/208 |
|---|---|---|---|
| 4,261,762 | 4/1981 | King | 148/1.5 |
| 4,282,924 | 8/1981 | Faretra | 165/80 C |
| 4,453,080 | 6/1984 | Berkowitz | 250/443.1 |
| 4,457,359 | 7/1984 | Holden | 165/80 C |
| 4,458,746 | 7/1984 | Holden et al. | 165/80 A |
| 4,491,173 | 1/1985 | Demand | 165/86 X |

OTHER PUBLICATIONS

King et al., "Experiments on Gas Cooling of Wafers," *Nucl. Instrum. Methods,* 189 (1981) pp. 169-173.
Hammer, "Cooling Ion Implantation Target," *IBM Technical Disclosure Bulletin,* vol. 19, No. 6, Nov. 1976, pp. 2270-2271.
Mack, "Wafer Cooling in Ion Implantation," *Ion Implantation: Equipment and Techniques, Proc. Fourth Int. Conf.,* Sep. 1982, (Springer-Verlag, 1983), pp. 221-233.
Model 80-10 High Current Ion Implantation System Brochure, Varian/Extrion Division, Feb. 1982.

*Primary Examiner*—Sheldon J. Richter
*Attorney, Agent, or Firm*—Stanley Z. Cole; William R. McClellan

[57] ABSTRACT

Apparatus for providing thermal transfer between a semiconductor wafer and a heat sink or source in a vacuum processing chamber includes a platen against which the wafer is sealed to define a thermal transfer region therebetween. The platen includes a passage for gas flow between the chamber and the thermal transfer region and a conduit for circulation of a cooling fluid. The platen further includes a fluid-actuated valve responsive to the pressure of the cooling fluid for closing the passage. When the pressure in the chamber reaches a predetermined value, the cooling fluid is turned on and closes the valve. Gas at the predetermined pressure, typically in the range of 0.5 to 100 Torr, is trapped in the thermal transfer region and conducts thermal energy. In a preferred embodiment, a plurality of platens are positioned on a rotating disc in an ion implantation system.

22 Claims, 8 Drawing Figures

APPARATUS FOR CONTROLLING THERMAL TRANSFER IN A CYCLIC VACUUM PROCESSING SYSTEM

BACKGROUND OF THE INVENTION

This invention relates to processing of semiconductor wafers in a vacuum chamber and, more particularly, to methods and apparatus for thermal transfer in an ion implantation system which utilizes gas as a transfer medium.

In the fabrication of integrated circuits, a number of processes have been established which involve the application of high energy beams onto semiconductor wafers in vacuum. These processes include ion implantation, ion beam milling and reactive ion etching. In each instance, a beam of ions is generated in a source and directed with varying degrees of acceleration toward a target. Ion implantation has become a standard technique for introducing impurities into semiconductor wafers. Impurities are introduced into the bulk of semiconductor wafers by using the momentum of energetic ions as a means of imbedding them in the crystalline lattice of the semiconductor material.

As energetic ions impinge on a semiconductor wafer and travel into the bulk, heat is generated by the atomic collisions. This heat can become significant as the energy level or current level of the ion beam is increased and can result in uncontrolled diffusion of impurities beyond prescribed limits. As device geometries become smaller, this uncontrolled diffusion becomes less acceptable. A more severe problem with heating is the degradation of patterned photoresist layers which are applied to semiconductor wafers before processing and which have relatively low melting points.

In commercial semiconductor processing, a major objective is to achieve a high throughput in terms of wafers processed per unit time. One way to achieve high throughput in an ion beam system is to use a relatively high current beam. However, large amounts of heat may be generated in the wafer. Thus, it is necessary to cool the wafer in order to prevent elevated temperatures from being attained.

Techniques for keeping the wafer temperature below a prescribed limit have included batch processing, in which the incident power is spread over a number of wafers, time-shared scanning of the beam and conductive cooling through direct solid-to-solid contact between a wafer and a heat sink. The cooling efficiency of systems employing solid-to-solid contact is limited by the extent to which the backside of the wafer contacts the thermally conductive surface, since, at the microscopic level, only small areas of the two surfaces (typically less than 5%) actually come into contact.

The technique of gas conduction is known to permit thermal coupling between two opposed surfaces and has been applied to semiconductor processing in vacuum. In one approach, gas is introduced into a cavity between a wafer and a supportn plate. The achievable thermal transfer with this approach, however, is limited, since bowing of the wafer occurs at low gas pressures.

Gas-assisted, solid-to-solid thermal transfer with a semiconductor wafer is disclosed in U.S. Pat. No. 4,457,359, filed May 25, 1982, and assigned to the assignee of the present application. A semiconductor wafer is clamped at its periphery onto a shaped platen. Gas under pressure is introduced into the microscopic void region between the platen and the wafer. The gas pressure approaches that of the preloading clamping pressure without any appreciable increase in the wafer-to-platen spacing. Since the gas pressure is significantly increased without any increase in the wafer-to-platen gap, the thermal resistance is reduced; and solid-to-solid thermal transfer with gas assistance produces optimum results. In both of these approaches, the gas is supplied from a gas source, including means for regulating the pressure, coupled to the thermal transfer region behind the wafer.

As the demand for higher throughput ion implantation systems increases, it will become necessary to utilize higher currents, thereby requiring the application of gas cooling to batch systems. Typically, in batch systems, a number of wafers, for example 25, are mounted on a large disc which is rotated during ion implantation. The ion beam can be scanned across the rotating disc or the disc can be translated mechanically during rotation to provide uniform ion dosage over the surface of the wafers.

The use of gas cooling in a batch processing system is complicated by two factors. First, the hardware required to introduce gas into the thermal transfer region behind the wafer must be repeated at each wafer location. This greatly increases the complexity and cost of the system. In addition, connections external to the disc must be made through rotary connections along the axis of rotation. Prior art rotating discs have been water cooled with the cooling water piped to the disc through a rotating seal. The addition of connections for gas cooling would further complicate this arrangement.

It is an object of the present invention to provide novel apparatus for thermal transfer with a semiconductor wafer in vacuum.

It is another object of the present invention to provide novel methods and apparatus for gas conduction thermal transfer with a semiconductor wafer in an ion implantation system utilizing liquid cooling of a heat sink.

It is still another object of the present invention to provide novel methods and apparatus for gas conduction thermal transfer in an ion implantation system utilizing a movable element for mounting a plurality of wafers.

It is yet another object of the present invention to provide methods and apparatus for thermal transfer with a semiconductor wafer in a vacuum chamber which is vented during a portion of the processing cycle.

SUMMARY OF THE INVENTION

According to the present invention, these and other objects and advantages are achieved in apparatus for providing thermal transfer between a workpiece and a heat sink or source in a vacuum processing chamber which is vented during one portion of an operating cycle and is vacuum pumped to a low pressure during another portion of the cycle. The apparatus comprises a workpiece mounting location including a platen against which the workpiece is sealed to define a thermal transfer region therebetween. The platen includes a passage for gas flow between the chamber and the thermal transfer region and a conduit for circulation of a cooling fluid. The mounting location further includes first-actuated valve means responsive to the pressure of the cooling fluid for controllably opening and closing the passage. The apparatus further includes means for controlling the pressure of the cooling fluid such that the valve means is closed during vacuum pumping when the pressure in the chamber reaches a predetermined intermediate pressure. Gas at the intermediate pressure is trapped in the thermal transfer region during processing and conducts thermal energy between the workpiece and the platen.

In a preferred embodiment, a plurality of workpiece mounting locations are positioned on a disc adapted for rotation in an ion implantation system. The control means includes means for sensing the pressure in the vacuum chamber and for providing a control signal when the chamber pressure reaches the intermediate pressure. The control means can further include a valve responsive to the control signal for turning on the cooling fluid.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
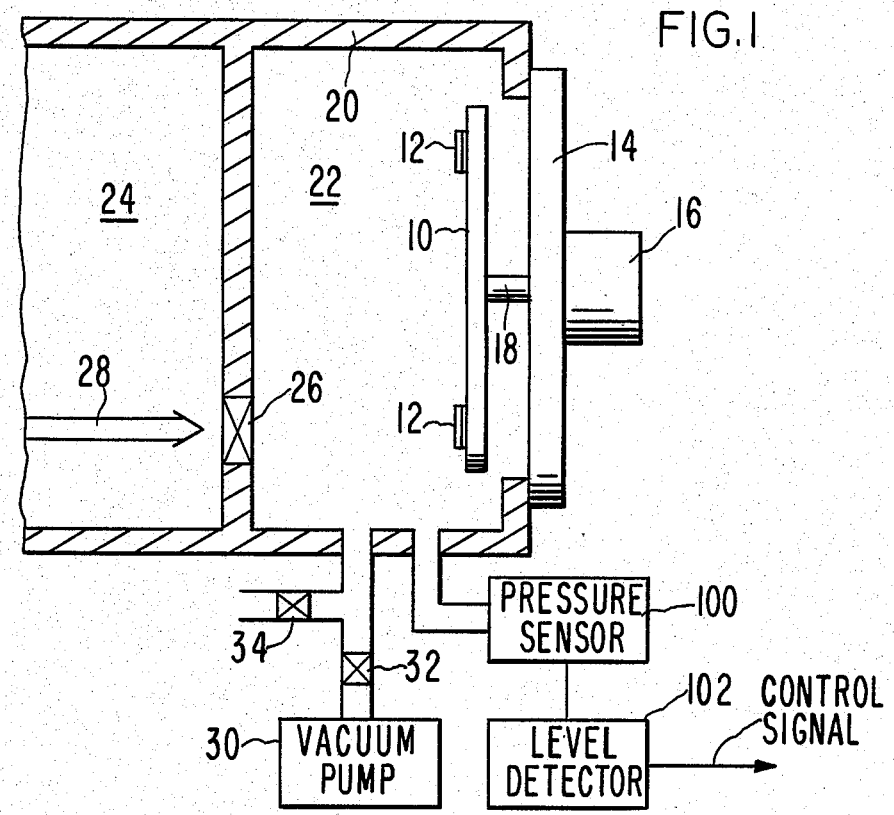
FIG. 1 is a simplified cross-sectional view of a batch processing ion implantation end station.

An end station and the adjacent portion of the beamline for a batch processing ion implantation system are shown in simplified form in FIG. 1. A rotating disc assembly includes a rotating disc 10, a plurality of semiconductor wafers 12 mounted on the disc 10, a chamber door 14 and a drive motor 16 for the rotating disc 10. The rotating disc 10 is connected by a drive shaft 18 through the chamber door 14 to the motor 16. During implantation, the chamber door 14 is sealed to a housing 20 to define an implant chamber 22. The housing 20 also defines a beamline vacuum chamber 24, which can be isolated from the implant chamber 22 by a gate valve 26. An ion beam 28, formed in an ion source and passed through appropriate mass analysis and ion optical elements (not shown), is applied to the wafers 12 through the gate valve 26. A vacuum pump 30 is coupled through an isolation valve 32 to the implant chamber 22. The implant chamber 22 is also coupled through an isolation valve 34 to the external environment for venting purposes. The beamline vacuum chamber 24 is coupled to a vacuum pump (not shown).

In operation, the ion implantation system shown in FIG. 1 processes semiconductor wafers in a cyclic manner. The cycle includes, generally, the placement of wafers in the system followed by ion implantation and then removal of the wafers from the system. More specifically, at the end of one implantation cycle, the gate valve 26 is closed to isolate the beamline vacuum chamber 24; and the implant chamber 22 is vented by closing valve 32 and opening valve 34. This raises the implant chamber 22 to atmospheric pressure. The chamber door 14 is opened, and the wafers 12 are removed and a new set of wafers is placed on the rotating disc 10. The exchange of wafers 12 can be automatic or manual. The chamber door 14 is then sealed to the housing 20. The valve 34 is closed, and the valve 32 to the vacuum pump 30 is opened. Vacuum pumping of the implant chamber 22 proceeds until the desired pressure level is attained. During vacuum pumping of the chamber 22, rotation of the disc is initiated. When a suitable pressure level has been attained, the gate valve 26 is opened; and implantation of the wafers 12 proceeds. In the embodiment shown in FIG. 1, the ion beam 28 is scanned in one dimension over a portion of the rotating disc 10 to assure uniform ion dosage of the wafers 12. In other systems known in the prior art, the ion beam 28 is held stationary; and the rotating disc is reciprocated in one dimension as well as rotated to achieve uniform ion implantation of the wafers. After implantation is completed, the implant chamber 22 is vented, as described above, and the process is repeated.

Figure 2:
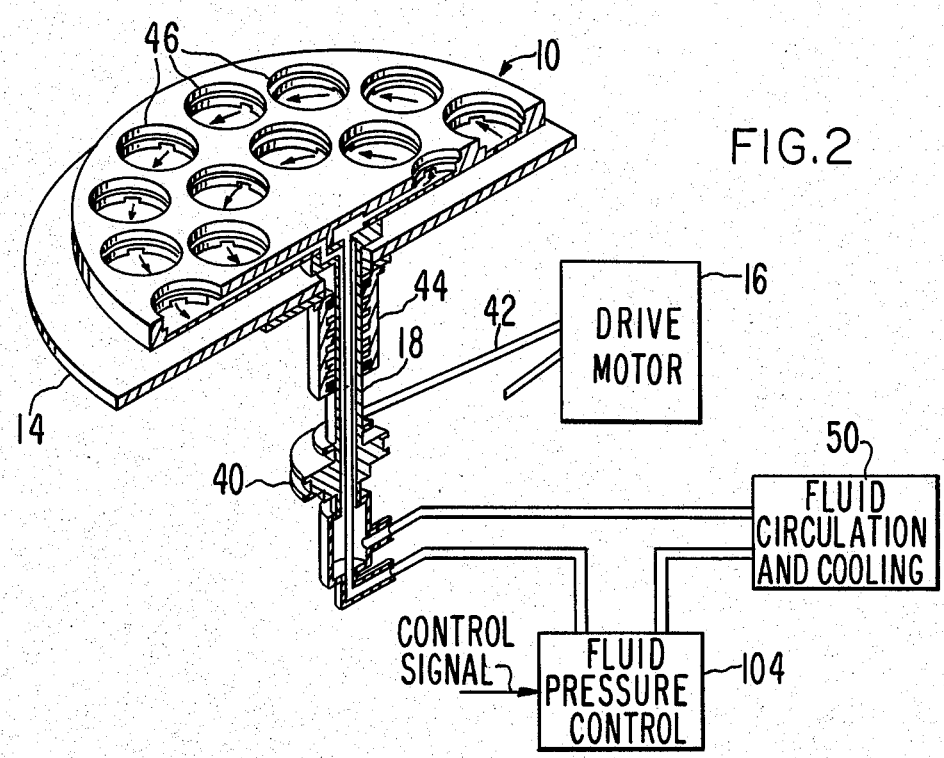
FIG. 2 is a cutaway view of a rotating disc for mounting wafers.

The rotating disc 10 and the chamber door 14 are shown in perspective cutaway view in FIG. 2. The rotating disc 10 is coupled to the drive motor 16 through a pulley 40 attached to the drive shaft 18, and a drive belt 42. The drive shaft 18 passes through a ferrofluidic seal 44 which permits rotary motion to be transmitted into the vacuum region of the implant chamber 22. The rotating disc 10 includes a plurality of wafer clamping locations 46, which are described in detail hereinafter. The rotating disc 10 is liquid cooled. A suitable cooling fluid, such as water, is circulated through internal passages in the disc 10 to each wafer clamping location 46. The passages in the disc 10 are connected through concentric passages in the drive shaft 18 to a circulation and cooling system 50 external to the vacuum chamber. The circulation and cooling system 50 typically includes a pump and a heat exchanger.

Figure 3:
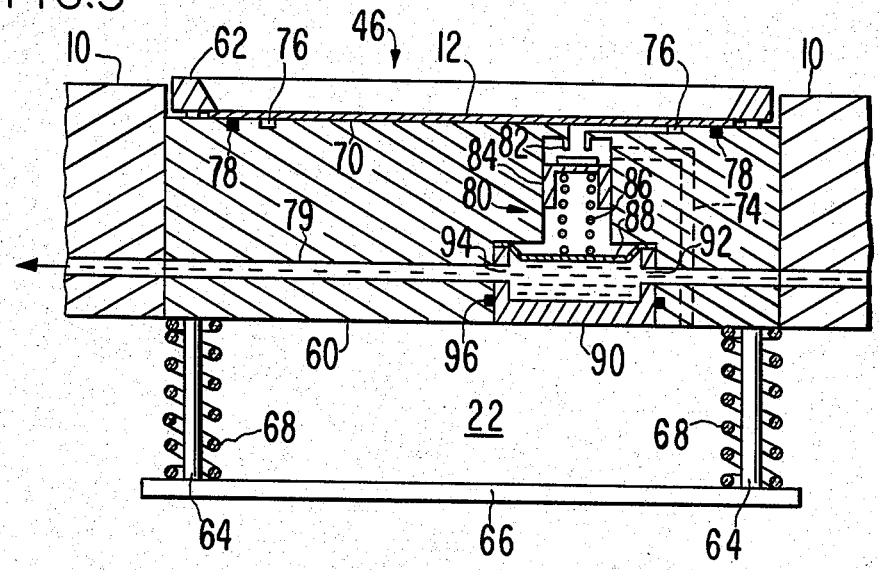
FIG. 3 is a simplified cross-sectional view of a wafer location on the rotating disc shown in FIG. 2.

A simplified cross-sectional view of one of the wafer clamping locations 46 on the rotating disc 10 is shown in FIG. 3. Included are a platen 60 mounted to the disc 10 and means for clamping the wafer 12 against the platen 60. The wafer clamping means includes a clamping ring 62, which is adapted to clamp the wafer at its circumferential edge against the platen 60. The clamping ring 62 is coupled by posts 64 through holes in the platen 60 to a plate 66 on the backside of the disc 10. Positioned on the posts 64 between the plate 66 and the backside of the platen 60 are springs 68 which draw the clamping ring 62 against the wafer 12 and firmly clamp it in place. When the wafer 12 is to be removed, a plunger (not shown) pushes the plate 66 upward, thereby compressing the springs 68, and lifts the clamping ring 62. The wafer 12 can be removed manually. Alternatively, it can be lifted by support posts or a vacuum chuck (not shown) for access by an automatic wafer handling system.

A top surface 70 of the platen 60, which faces the backside of the wafer 12, can be flat or can include a cavity in its central portion. Preferably, however, the top surface 70 has a convex contour. The wafer 12 is prestressed by the convex contour and is brought into intimate contact with the top surface 70. Regardless of the contour of the top surface 70, however, the contact between the wafer 12 and the platen 60 on a microscopic scale occurs over no more than 5% of the surface areas. When the microscopic voids between contact points are at high vacuum, little thermal transfer occurs except at the points of actual contact. It is known that the introduction of gas into the region between the wafer 12 and the top surface 70 of the platen 60 enhances thermal transfer. The thermal transfer region can be a cavity, or can be the microscopic voids when the wafer and the platen are in contact. The pressure should be as high as possible without causing bowing of the wafer 12. In the preferred embodiment, in which the wafer 12 is prestressed against the platen 60, this pressure is in the range of about 5 to 100 Torr and, preferably, about 20 to 30 Torr. In other embodiments, the gas pressure can be as low as 0.5 Torr.

The thermal transfer region between the wafer 12 and the top surface 70 of the platen 60 is connected by a passage 74 to the backside of the rotating disc 10. Thus, there is a direct passage between the thermal transfer region behind the wafer 12 and the implant chamber 22. To insure that the entire thermal transfer region is at about the same pressure, a circumferential groove 76, having a diameter smaller than that of the wafer 12, is provided in the top surface 70 of the platen 60. In a preferred embodiment, the passage 74 is connected to the groove 76. Further included in the platen 60 is a circumferential seal such as an elastomer O-ring 78 positioned on the top surface 70 and having a diameter slightly smaller than the wafer 12. The O-ring 78 seals the thermal transfer region behind the wafer 12 from the vacuum implant chamber 22. The platen 60 and the disc 10 are provided with a passage, or conduit 79, for the circulation of a cooling fluid, such as water. The conduit 79 is in the form of one or more continuous passages through the disc 10 which connect through the shaft 18 to the circulation and cooling system 50.

In accordance with the present invention, a fluid-actuated valve 80 is mounted in the platen 60 and is operative to control the opening and closing of the passage 74. The operation of the valve 80 is controlled by the pressure of the cooling fluid in conduit 79. An increase in pressure of the cooling fluid causes the valve 80 to close the passage 74 and seal the thermal transfer region behind the wafer 12. Typically, the increase in pressure is accomplished by turning on the cooling fluid flow.

The platen 60 is provided with a recess adapted for mounting of the valve 80. In addition, the platen 60 is provided with a valve seat along the passage 74, which can be sealed by a valve closure member. In the example of FIG. 3, the valve seat comprises a lip portion 82. The valve 80 includes a closure member 84 coupled through a spring 86 to a flexible circular diaphragm 88. The diaphragm 88 is sealed at its peripheral edge to the upper rim of a cup-shaped member 90 which is provided with an inlet 92 and an outlet 94. The inlet 92 and the outlet 94 connect the interior of the cup-shaped member 90 to the conduit 79. An elastomer O-ring 96 seals the valve 80 into the platen 60.

In operation, no cooling fluid is circulated through the conduit 79 and the interior portion of the cup-shaped member 90 until closing of the valve 80. With no fluid circulation, the cooling fluid is at relatively low pressure; and the diaphragm 88 is in a relaxed position. When closing of the passage 74 is desired, the flow of cooling fluid is turned on, and the pressure of the cooling fluid is increased above a predetermined value. The diaphragm 88 flexes upwardly, thereby moving the closure member 84 into a sealed position against the lip portion 82. In this position, the thermal transfer region behind the wafer 12 is sealed, and gas is trapped therein. As an alternative to turning the flow of cooling fluid on and off, the flow can be maintained continuously and the pressure increased to close the valve 80. It will be understood by those skilled in the art that the fluid-actuated valve 80 shown in FIG. 3 is one of many possible embodiments of a fluid-actuated valve. Furthermore, the valve is not necessarily mounted in the platen 60 as shown. It can be mounted in any convenient position, such as on the backside of the platen 60 or on the disc 10. The only requirements is that it be adapted for closing the passage between the thermal transfer region and the implant chamber.

Figure 5:
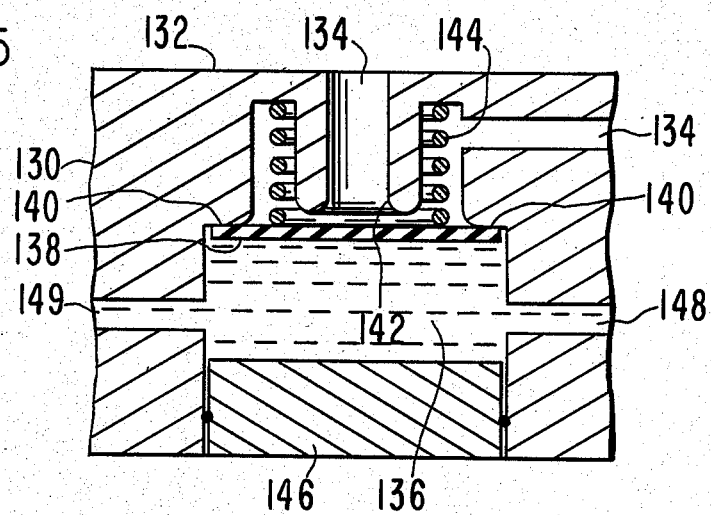
FIGS. 5, 6, 7A and 7B show alternate embodiments of fluidactuated valves which can be utilized in the apparatus of FIG. 3.

Another preferred embodiment of a fluid-actuated valve is shown in FIG. 5. A platen 130, which is shown in partial cross-sectional view, includes a wafer-mounting surface 132 and a passage 134 between the surface 132 and the implant chamber for gas flow. The platen 130 is formed with a mounting opening 136 for the valve. A resilient diaphragm 138 is sealed at its outer periphery to a flange 140 in the mounting opening 136. The diaphragm 138 is positioned adjacent to a lip portion 142 in the passage 134. A spring 144 urges the diaphragm 138 away from the lip portion 142. The mounting opening 136 is sealed by a plug 146 and is connected to cooling fluid passages 148, 149 in the platen 130. When the cooling fluid is turned on or increased in pressure, the diaphragm 138 is pressed against the lip portion 142 and seals the passage 134. When the cooling fluid is turned off, the spring 144 insures that the passage 134 is open.

Figure 6:
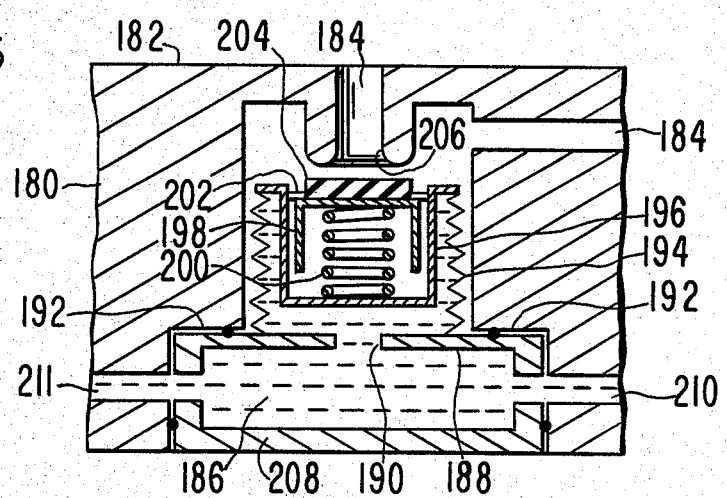

Yet another preferred embodiment of a fluid-actuated valve is shown in FIG. 6. A platen 180, having a wafer-mounting surface 182 and a gas passage 184, is provided with a mounting opening 186 for the valve. As element 188, having a hole 190 therethrough is sealed to a flange 192. A bellows 194 is sealed to the upper surface of the element 188. The opposite end of the bellows 194 is sealed to the outer rim of a cup-shaped member 196. Positioned in the cup-shaped member 196 is a piston 198 and a spring 200. The piston 198 is held within the cup-shaped member 196 by a retainer 202. The spring 200 urges the piston upwardly out of the cup-shaped member 196 and against the retainer 202. A sealing pad 204, adapted for sealing a lip portion 206 of the passage 184, is positioned on the piston 198. The mounting opening 186 is sealed by a plug 208 and is connected to cooling fluid passages 210, 211 in the platen 180. When the cooling fluid is turned on or increased in pressure, the bellows 194 expands and presses the sealing pad 204 against the lip portion 206, thereby sealing the passage 184. When the cooling fluid is turned off, the bellows retracts and opens the passage 194. This configuration provides the advantage that the passage 184 is sealed by the relatively constant force of the spring 200 regardless of large variations in cooling fluid pressure. The centrifugal force of the rotating disc can produce variations in cooling fluid pressure. However, the sealing surfaces experience a fixed force and are not damaged.

Figure 7A:
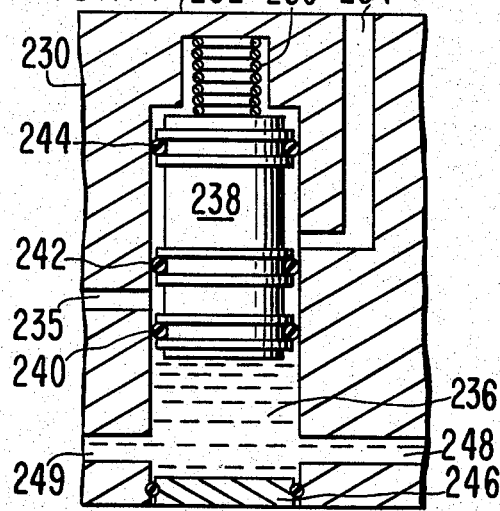
Figure 7B:
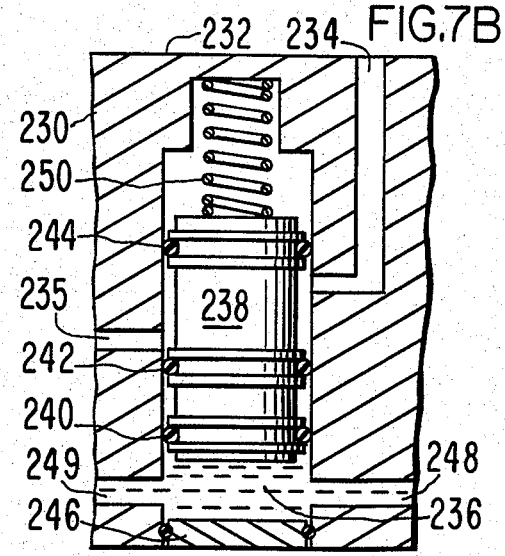

Still another preferred embodiment of a fluid-actuated valve is shown in FIGS. 7A and 7B. A platen 230, having a wafer-mounting surface 232 and gas passages 234, 235, is provided with a mounting opening 236 for the valve. A cylindrical plunger 238 is positioned in the opening 236 and is provided with O-rings 240, 242, 244 for sealing, as described hereinafter. The lower portion of the opening 236 is sealed by a plug 246 and is connected to cooling fluid passages 248, 249. The gas passages 234 and 235 connect to the opening 236 at different points along its length. A spring 250 urges the plunger 238 downwardly toward the plug 246. The closed position of the valve, in which the cooling fluid is turned on or pressurized, is shown in FIG. 7A. The passage 234 is sealed from the passage 235 by the O-ring 242; the cooling fluid is sealed from the passages 234 and 235 by the O-ring 240. The open position of the valve, in which the cooling fluid is turned off or lowered in pressure is illustrated in FIG. 7B. The spring 250 pushes the plunger 238 down to the open position. The passages 234 and 235 are now in gas communication but are sealed from the cooling fluid by the O-rings 240, 242.

Means for controlling the operation of the fluid-actuated valve 80 at each of the locations 46 is shown in FIGS. 1 and 2. A pressure sensor 100 is positioned so as to sense the implant chamber vacuum level (not the cooling fluid pressure) in the vicinity of the rotating disc 10. The output of the pressure sensor 100 is coupled to a level detector 102 which provides a control signal when the pressure in the implant chamber 22 is below a predetermined intermediate pressure level. The intermediate pressure, typically in the range of 0.5 to 100 Torr, is above the pressure required for ion implantation, typically $5 \times 10^{-6}$ Torr. Referring now to FIG. 2, the control signal from the level detector 102 is applied to a fluid pressure control unit 104, such as a valve, which controls the pressure of the cooling fluid circulated through the disc 10 to each of the wafer locations 46. The level detector 102 can be a comparator which compares the output signal from the pressure sensor 100 with a reference level which represents the predetermined intermediate pressure in the implant chamber 22 and provides a control signal when the pressure sensor signal is below the reference level. The fluid pressure control unit 104 can be a controllable valve or a piston which is controlled electrically or by an air valve.

Figure 4:
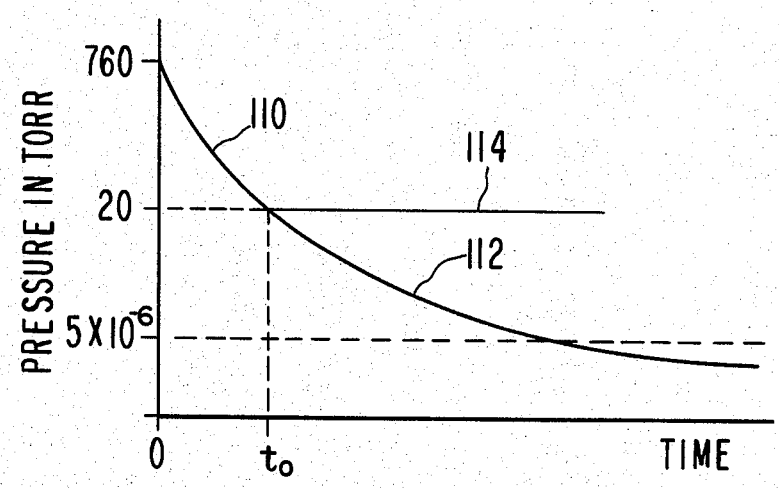
FIG. 4 is a graph of pressure as a function of time illustrating the operation of the present invention.

The operation of the apparatus in accordance with the present invention is described with reference to FIG. 4 in which pressure in the implant chamber 22 and in the thermal transfer region behind the wafer 12 are plotted as a function of time. When the chamber door 14 is closed, the vacuum pump 30 begins evacuating the implant chamber 22. Initially, the implant chamber 22 is at atmospheric pressure, or 760 Torr. The fluid-actuated valve 80 is open, thereby permitting the flow of air and equalization of pressure between the thermal transfer region and the implant chamber 22. The operation of the vacuum pump 30 reduces the pressure in the implant chamber 22, as indicated by the curve 110 in FIG. 4. In the present example, the predetermined intermediate pressure required for thermal transfer in the region behind the wafer 12 is 20 Torr. When the pressure sensor 100 senses a pressure of 20 Torr in the implant chamber 22 at time $t_0$, the level detector 102 provides a control signal to the fluid pressure control unit 104. In response to the control signal, the fluid pressure control unit 104 increases the pressure of the cooling fluid by turning on the flow of cooling fluid. The increased pressure closes the valve 80, as described hereinabove, and seals the passage 74. The disc 10 may or may not be rotating. Typically, however, disc rotation is initiated during vacuum pumpdown, since some time is required for the disc to reach its final speed. The closure of the valve 80 traps the intermediate pressure of 20 Torr in the thermal transfer region behind the wafer 12. The vacuum pump 30 continues to operate and further reduces the pressure in the implant chamber 22, as indicated by the curve 112 in FIG. 4. When the pressure in the implant chamber 22 reaches a suitable level for ion implantation, typically $5 \times 10^{-6}$ Torr, the gate valve 26 is opened, and ion implantation proceeds. During ion implantation, the valve 80 remains closed; and the pressure of 20 Torr is trapped in the thermal transfer region, as indicated by the curve 114 in FIG. 4. After ion implantation is completed, the implant chamber 22 is vented. The increase in pressure in the implant chamber 22 above the intermediate pressure causes the control signal to change state, and the circulation of the cooling fluid is stopped. The valve 80 opens, and the pressure is equalized between the implant chamber 22 and the thermal transfer region behind the wafer. Thus, the wafer 12 can easily be removed from the system.

The present invention permits gas cooling to be utilized in a batch processing system without connecting a gas source to each individual wafer location. The gas utilized for thermal transfer is controlled by the cooling fluid typically utilized on the rotating disc. No additional signals or fluids are required to be coupled through the rotating shaft. The intermediate pressure utilized for thermal transfer can be altered simply by changing the reference level to which the output of the pressure sensor 100 is compared. The cooling fluid pressure control system comprising the pressure sensor 100, the level detector 102 and the pressure control unit 104 are relatively fast-acting. Thus, gas cooling is incorporated into the system without introducing delays or a slowdown of operation.

Hereinabove, the thermal transfer process has been described as cooling of wafers. It will be understood that the present invention is equally applicable when heating of the wafers by a heated platen is desired. The technique of utilizing the cooling fluid to operate a valve which traps gas at a predetermined pressure in a thermal transfer region is highly advantageous when applied to a multiple wafer site rotating disc. However, it will be understood that the present invention is not limited to this application. It can be applied to batch processing systems which utilize other configurations for mounting wafers for mechanical motion. Furthermore, the present invention is not limited to batch processing systems and is not limited to ion implantation systems. The invention can be applied to one or more stationary wafer-mounting sites and can be applied generally to vacuum processing of wafers.

While there has been shown and described what is at present considered the preferred embodiments of the invention, it will be obvious to those skilled in the art that various changes and modifications may be made therein without departing from the scope of the invention as defined by the appended claims.

We claim:

1. In a vacuum processing chamber which is vented during one portion of a cycle and is vacuum pumped to a low pressure during another portion of said cycle, apparatus for providing thermal transfer between a workpiece and a heat sink or source comprising:
   a workpiece mounting location including a platen against which said workpiece is sealed to define a thermal transfer region therebetween, said platen including a passage for gas flow between said chamber and said thermal transfer region and a conduit for circulation of a cooling fluid, said mounting location further including fluid-actuated valve means responsive to the pressure of said cooling fluid for controllably opening and closing said passage; and means for controlling the pressure of said cooling fluid such that said valve means is closed during vacuum pumping when the pressure in said chamber reaches a predetermined intermediate pressure, whereby gas at said intermediate pressure is trapped in said thermal transfer region during processing and conducts thermal energy between said workpiece and said platen.

2. The apparatus as defined in claim 1 wherein said control means includes means for sensing the pressure in said vacuum chamber and for providing a control signal when said chamber reaches said intermediate pressure.

3. The apparatus as defined in claim 2 wherein said control means further includes means responsive to said control signal for varying the pressure of said cooling fluid.

4. The apparatus as defined in claim 3 wherein said means responsive to said control signal includes a valve for controlling the flow of said cooling fluid.

5. The apparatus as defined in claim 1 wherein said fluid-actuated valve includes a flexible member which isolates said cooling fluid conduit from said gas passage and transmits motion for controlling said fluid-actuated valve.

6. The apparatus as defined in claim 1 wherein said fluid-actuated valve includes a movable plunger for sealing said gas passage.

7. The apparatus as defined in claim 1 wherein said vacuum processing chamber is an ion implantation chamber and said workpiece is a semiconductor wafer.

8. The apparatus as defined in claim 7 wherein a plurality of said workpiece mounting locations are positioned on a movable workpiece support and said cooling fluid is circulated to each of said locations.

9. The apparatus as defined in claim 8 wherein said workpiece support comprises a disc adapted for rotation about a central axis.

10. Apparatus for providing thermal transfer with semiconductor wafers in an ion implantation system including a vacuum chamber which is vented during one portion of an operating cycle and is vacuum pumped to a low pressure during another portion of said cycle, said apparatus comprising:

a wafer support adapted for movement relative to an ion beam and having locations for mounting a plurality of semiconductor wafers, said wafer support being provided with a conduit for circulation of a cooling fluid to each of said locations, each of said locations including a platen against which a wafer is sealed to define a thermal transfer region therebetween, a passage providing gas flow between said thermal transfer region and said chamber, and fluid-actuated valve means responsive to said cooling fluid for controllably opening and closing said passage;

means for controlling said cooling fluid such that each of said valve means is closed during vacuum pumping when the pressure in said chamber reaches a predetermined intermediate pressure; and means for circulating and cooling said cooling fluid, whereby gas at said intermediate pressure is trapped in said thermal transfer region during ion implantation and conducts thermal energy between said wafer and said platen.

11. The apparatus as defined in claim 10 wherein said fluid-actuated valve includes a flexible member which isolates said cooling fluid conduit from said passage in said platen and transmits motion for controlling said fluid-actuated valve.

12. The apparatus as defined in claim 11 wherein said fluid-actuated valve includes means for opening upon reduction of the pressure of said cooling fluid below a prescribed value.

13. The apparatus as defined in claim 11 wherein said flexible member comprises a metal diaphragm.

14. The apparatus as defined in claim 11 wherein said flexible member comprises a bellows.

15. The apparatus as defined in claim 10 wherein said control means includes means for sensing the pressure in said vacuum chamber and for providing a control signal when said chamber reaches said intermediate pressure.

16. The apparatus as defined in claim 15 wherein said control means further includes means responsive to said control signal for varying the pressure of said cooling fluid.

17. The apparatus as defined in claim 16 wherein said means responsive to said control signal includes a valve for controlling the flow of said cooling fluid.

18. The apparatus as defined in claim 10 wherein said fluid-actuated valve includes a movable plunger for sealing said passage.

19. The apparatus as defined in claim 10 wherein said wafer support comprises a disc adapted for rotation about a central axis.

20. The apparatus as defined in claim 19 wherein each of said platens includes a surface with a convex contour for contacting said wafer.

21. The apparatus as defined in claim 20 wherein said intermediate pressure is in the range of 0.5 to 100 Torr.

22. The apparatus as defined in claim 10 wherein said passage runs from said thermal transfer region to the backside of said platen and said fluid-actuated valve means is mounted in said platen.

* * * * *